United States Patent [19]

Derossi

[11] 4,218,822
[45] Aug. 26, 1980

[54] VISUAL-DISPLAY DEVICE WITH ERROR CORRECTION

[76] Inventor: Piero M. Derossi, Corso Giovanni Lanza 55, Torino, Italy

[21] Appl. No.: 974,050

[22] Filed: Dec. 28, 1978

[30] Foreign Application Priority Data

Dec. 30, 1977 [IT] Italy .................. 69958 A/77

[51] Int. Cl.² ............................. G02B 27/02
[52] U.S. Cl. ............................ 33/1 D; 33/317 D; 33/348; 33/356; 116/202; 116/327; 116/DIG. 5
[58] Field of Search .............. 33/348, 1 D, 356, 363, 33/366, 317 R, 317 D, 1 L; 116/DIG. 5, 202, 327, 328, 329, 330, 331, 332; 250/463

[56] References Cited

U.S. PATENT DOCUMENTS

| 43,036 | 6/1864 | Martin | 33/356 |
| 2,023,891 | 12/1935 | Kaess | 33/356 X |
| 2,178,306 | 10/1939 | Lauck | 33/317 R |
| 2,323,253 | 6/1943 | Sperry | 33/356 |
| 2,589,263 | 3/1952 | Kenosian | 116/202 |
| 3,677,619 | 7/1972 | Mackenzie | 116/DIG. 5 |

Primary Examiner—William D. Martin, Jr.
Attorney, Agent, or Firm—Montague & Ross

[57] ABSTRACT

In order to correct errors in the reading of a graduated scale, especially on a compass card driven by a damped gyroscopic system, the scale is juxtaposed with a block having slits simultaneously alignable with different scale graduations and illuminable by respective light sources within the block. The light sources can be selectively energized by a rotary switch whose bank contacts are connectable via a changeover switch to either of two groups of light sources for positive or negative deviations from a reference position; the slit so illuminated serves as a pointer by coacting with a confronting scale graduation.

7 Claims, 5 Drawing Figures

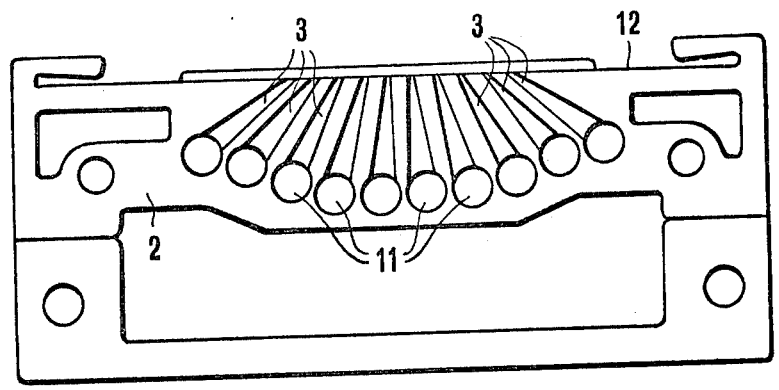
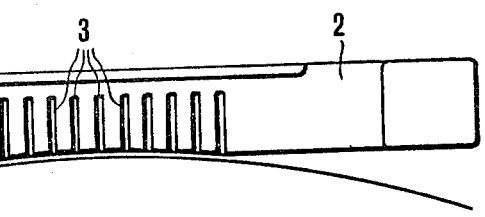
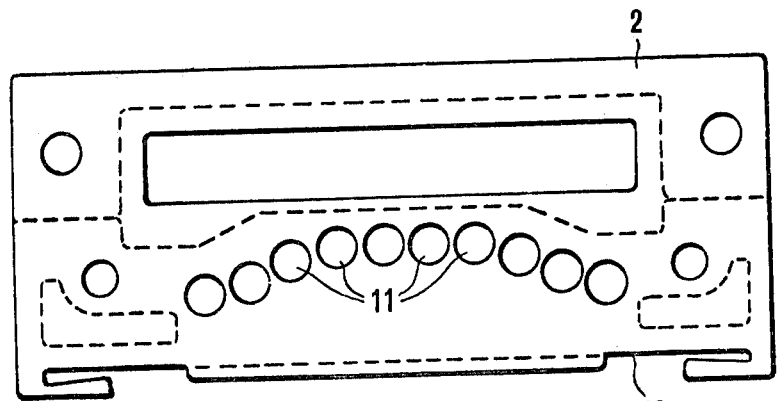

VISUAL-DISPLAY DEVICE WITH ERROR CORRECTION

FIELD OF THE INVENTION

The present invention relates to a device for visually displaying a variable quantity with correction of errors, due to changes in an independently ascertainable external parameter, affecting the reading of a graduated scale movable with reference to a coacting index by a force related to that quantity. My invention applies particularly, but not exclusively, to the correction of the latitude error in the reading of the card of a steering gyrocompass of the type wherein the damping of the gyroscopic system is effected by the application of a torque around the azimuth axis.

BACKGROUND OF THE INVENTION

As is known, the aforesaid damping has the object of suppressing the tendency of the gyroscopic axis of a gyrocompass to hunt along an elliptical path, with a progressive approach to a stop position, along a spiral path. However, the application of a torque for that purpose has the consequence that the orientation of the spin axis shifts, with respect to the true meridian, eastward in the northern hemisphere and westward in the southern hemisphere. The error may be calculated for a given compass as a function of the geographical latitude where the compass is situated, and may be tabulated for a correction of the reading or may be directly corrected in various modes. The first mode of correction consists in the rotation of the entire binnacle of the compass through an angle equal and opposite to the calculated error, but that is not very practical because of the dimensions and the weight of the apparatus. A second mode consists in the displacement of the index with respect to which the reading on the graduated compass card is made, or in the displacement of the connection of the compass card with respect to the compass, but this requires complex mechanisms with sealing difficulties due to the fact that the compass is normally immersed in a liquid. Other modes consist in the direct action on the gyroscopic system to compensate the error, but they present the inconvenience of putting the entire equipment out of service in case of failure.

OBJECT OF THE INVENTION

The object of the present invention is to facilitate a correction of a reading error of the aforedescribed kind even where various difficulties militate against the usual methods, as it occurs particularly in the case of the correction of a latitude error in the reading of a compass card.

SUMMARY OF THE INVENTION

I realize this object, in accordance with my present invention, by providing an opaque block formed with a multiplicity of closely juxtaposed slits terminating at a viewing face which is juxtaposed with a graduated scale carrier, the latter being movable relatively to the block by a force corresponding to the variable quantity to be displayed, i.e. the torque exerted by a gyroscopic system in the specific instance of a gyrocompass. The ends of the slits remote from the viewing face can be individually illuminated by light-emitting means operatively coupled with control means such as a selector switch whose setting is determined in accordance with the ascertained value of the external parameter giving rise to the reading error to be corrected, i.e. of the geographical latitude in the case of a gyrocompass. The selectively illuminated slit then acts as the index coacting with the graduations of the scale carrier.

According to a more particular feature of my invention, the light-emitting means comprises a multiplicity of light sources which are respectively juxtaposed with the remote slit ends and can be individually activated in different positions of the aforementioned selector switch. The selectively illuminated slit is displaced from a zero or reference position by an angle equal and opposite to the error to be corrected. The control member of the selector switch may be directly graduated with the values of the parameter from which the error to be corrected depends, namely, in the specific case described, in latitude values; in this way the correction is introduced, for latitude zones, by simply setting the switch on the latitude value nearest the latitude determined for the vehicle on which the compass is installed.

In case the instrument on which the reading is effected is provided with means for transmitting the indication to associated repeaters, the same selector switch may be coupled to a suitable member designed to introduce a proper correction, by other means, in the transmitted indication.

BRIEF DESCRIPTION OF THE DRAWING

A nonlimiting exemplary embodiment of the device according to the invention is schematically shown in the accompanying drawings wherein:

FIG. 3 shows, on an enlarged scale, a block acting as an index, viewed from its useful face; and FIGS. 4 and 5 are two side-elevational views of the block according to FIG. 3.

SPECIFIC DESCRIPTION

Figure 1:
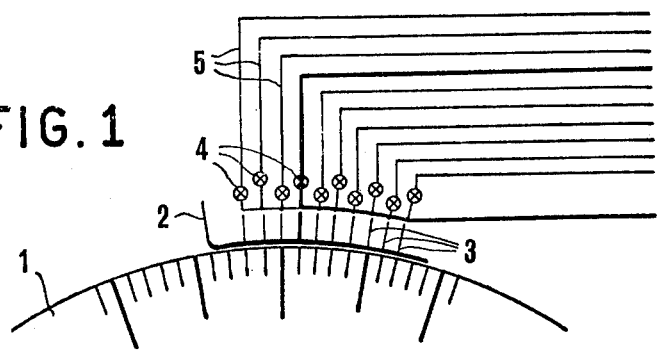
FIG. 1 illustrates in a general manner the principle of the invention.

In FIG. 1 there is indicated a mobile graduated scale formed, in this case, as a graduated rotating disk, such as the compass card of a steering gyrocompass. The index is constituted by a stationary block 2 in which slits 3 are formed, these slits terminating at a viewing face 12 (FIGS. 3-5) of the block. Behind each slit 3 there is arranged a lamp 4 energized by a lead 5. As will be apparent, by feeding current to a particular lead 5, the corresponding lamp 4 lights and renders luminous and therefore visible a given slit 3 which is thus enabled to act as an index, while the other slits remain invisible or slightly visible and do not disturb the reading. The distance between the various slits 3 is selected as a function of the approximation acceptable in the reading, so that the intoduction of the correction for discrete values, rather than in a continuous form, does not involve drawbacks. For example, in the case of a gyrocompass card, the distance between the slits 3 may correspond to an interval of one degree.

It is obvious that the graduated scale, mobile with respect to index 2, could have a shape different from a disk in other applications, e.g. could be rectilinear, cylindrical and so on. Since the distance between the various slits 3 is generally rather small, suitable configurations for the block 2 must be adopted, as exemplified in the following, to allow for the installation of the light sources 4.

The movement of the scale carrier 1 relative to block 2, of course, is independent of the external parameter (here degrees latitude) taken into account in the positioning of selector switch 7.

Figure 2:
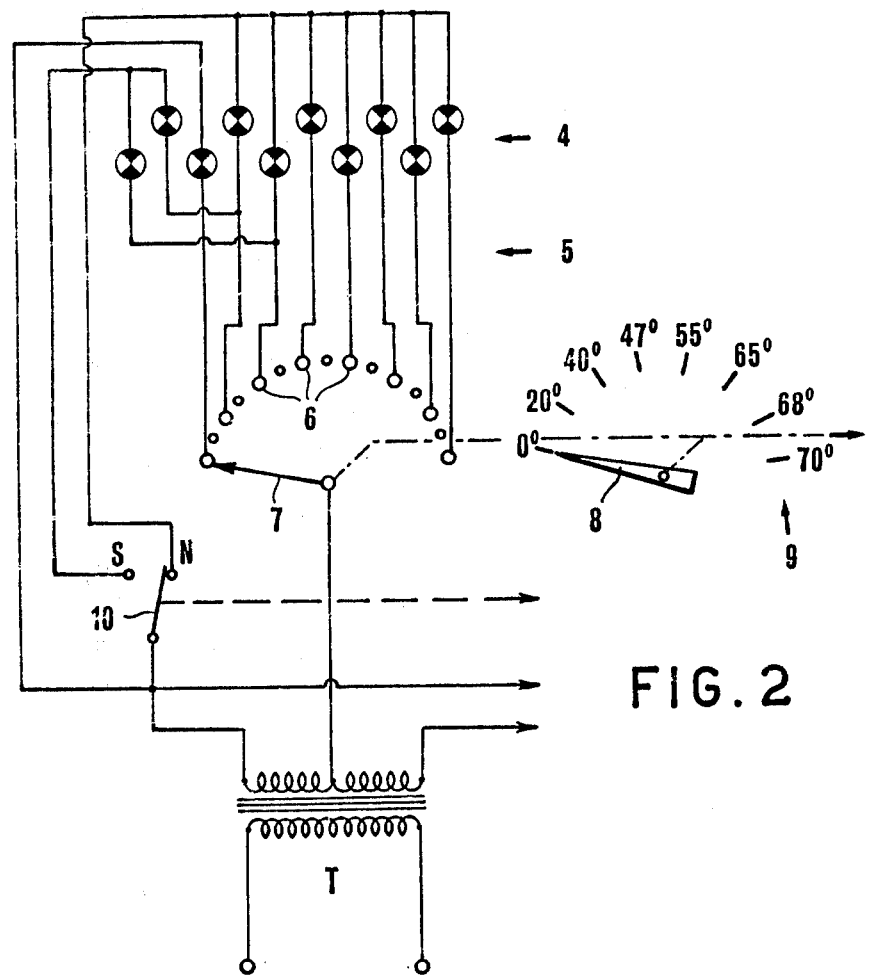
FIG. 2 shows an electric diagram of a selector system for energizing and switching the light sources of the device.

To choose the lamp 4 to be illuminated, the various leads 5 may be connected to contacts 6 of a rotating selector switch 7 (FIG. 2) which may be controlled by a mobile knob 8 in front of a scale 9 which is directly graduated with the latitude values corresponding to the error correction brought about by the lighting of the corresponding lamps 4. Furthermore, a changeover switch 10 serves to direct the feed to two different series of lamps 4 because the error correction, in the particular case of a latitude error, must be of opposite sign according to whether the latitude where the compass is situated, and correspondingly that to which the rotating switch 7 is set, is north or south. Only two lamps of the series assigned to the "south" position (S) of switch 10, to the left of the reference position marked by the illustrated position of switch 7, have been shown in FIG. 2. The energization may be supplied by a transformer T. The mechanical controls of selector switch 7 and changeover switch 10 as well as the electrical connections of transformer T are shown provided with arrowheads, in order to recall that they can be used for other introductions of corrections affected in the same or another manner, e.g. in the transmission of the indication to repeaters or other users.

As shown by FIGS. 3 to 5, the block 2, in which slits 3 are formed, may be particularly shaped to permit the use of light sources, such as incandescent lamps, having a size greater than the distance between the slits 3 on the viewed surface of block 2. In this case, cavities 11 of suitable dimensions are formed in the block 2 for insertion of the light sources and the slits 3 widen fan-wise, starting from the viewing face 12 of block 2, each one up to a cavity 11. The light sources, e.g. lamps, may be mounted on a printed circuit and introduced into the cavities 11 from the face of block 2 visible in FIG. 5, so that they penetrate close to the opposite face, visible in FIG. 4, in which there are provided the slits 3 which taper toward the viewed face 12. The light issues from the slits 3 after multiple reflections on the inner surfaces of the cavities 11 and the slits 3.

As the case may be, the light sources can be constituted by lamps of incandescent, gas-discharge or fluorescent type as well as by luminescent members such as light-emitting diodes (LED), for example.

It is to be understood that different modifications and substitutions of technical equivalents may be introduced in what has been described and illustrated by way of example, without thereby departing from the bounds of the invention as defined by the appended claims.

I claim:

1. A device for visually displaying a variable quantity with correction of reading errors due to changes in an independently ascertainable external parameter, comprising:
   an opaque block provided with a viewing face and with a multiplicity of closely juxtaposed slits terminating at said viewing face;
   light-emitting means for individually illuminating an end of any one of said slits remote from said viewing face;
   control means operatively coupled with said light-emitting means for training light therefrom upon the remote end of a slit selected in accordance with the ascertained value of said external parameter; and
   a graduated scale carrier juxtaposed with said viewing face and movable relatively to said block by a force corresponding to said variable quantity for giving a reading of the latter by the coaction of any illuminated slit with the graduations of said carrier.

2. A device as defined in claim 1 wherein said light-emitting means comprises a multiplicity of light sources respectively juxtaposed with the remote ends of said slits, said control means including a selector switch having different positions for activating any one of said light sources at a time.

3. A device as defined in claim 2 wherein said block is provided with mutually separated cavities at the remote ends of said slits, said light sources being respectively received in said cavities.

4. A device as defined in claim 2 or 3 wherein said light sources are more widely spaced apart than the terminations of said slits at said viewing face.

5. A device as defined in claim 4 wherein said slits converge from the vicinity of said light sources to said viewing face.

6. A device as defined in claim 2 or 3 wherein said slits and said light sources are divided into two series on opposite sides of a reference position, said control means further including a changeover switch for activating, in a position of said selector switch assigned to a given reading-error magnitude, an associated light source in either one of said series according to the sign of the reading error to be corrected.

7. A device as defined in claim 6 wherein said carrier is a compass card, said selector switch being provided with a control member calibrated in terms of geographical latitude, said changeover switch having two alternate positions respectively allocated to the northern and the southern hemisphere.

* * * * *